US005780925A

United States Patent [19]

Cipolla et al.

[11] Patent Number: 5,780,925
[45] Date of Patent: Jul. 14, 1998

[54] LEAD FRAME PACKAGE FOR ELECTRONIC DEVICES

[75] Inventors: Thomas Mario Cipolla. Katonah; Paul William Coteus. Yorktown Heights, both of N.Y.

[73] Assignee: International Business Machines Corporation. Armonk. N.Y.

[21] Appl. No.: 569,561

[22] Filed: Dec. 8, 1995

Related U.S. Application Data

[63] Continuation of Ser. No. 171,890, Dec. 22, 1993, abandoned, which is a continuation of Ser. No. 968,084, Oct. 28, 1992, abandoned.

[51] Int. Cl.$^6$ ............................................. H01L 23/495
[52] U.S. Cl. ........................... 257/676; 257/686; 257/777
[58] Field of Search .................................. 257/666, 676, 257/787, 686, 777

[56] References Cited

U.S. PATENT DOCUMENTS

| | | | |
|---|---|---|---|
| 4,208,698 | 6/1980 | Narasimhan | 361/414 |
| 4,937,656 | 6/1990 | Kohara | 257/787 |
| 5,012,323 | 4/1991 | Farnworth | 357/75 |
| 5,041,903 | 8/1991 | Millerick et al. | 257/676 |
| 5,075,252 | 12/1991 | Schendelman | 437/207 |

FOREIGN PATENT DOCUMENTS

| | | |
|---|---|---|
| 4-116859 | 4/1992 | Japan . |
| 4302164 | 10/1992 | Japan . |
| WO8502060 | 5/1985 | WIPO . |

*Primary Examiner*—Sara W. Crane
*Assistant Examiner*—Roy Potter
*Attorney, Agent, or Firm*—Daniel P. Morris

[57] ABSTRACT

An electronic device packaging structure is described which contains a lead frame on which the electronic device is disposed. The electronic device has contact locations at one edge thereof. The lead frame has leads which extend under the electronic device and inwardly from the opposite direction. Wires are wire bonded between electronic device contact locations and the beam leads which extend under the electronic device and the ends of the leads which extend inwardly from the opposite direction. Two electronic devices are stacked in at an offset with respect to each to expose contact locations on the surface of each electronic device at an edge of each electronic device to form a stepped surface exposing a plurality of electronic device contact locations. Preferably, the chips are identical and rotated 180° with respect to each other. Some of the leads of the lead frame for the double dense memory extend continuously under the stack to provide signal inputs through bit, address, control, power and ground inputs to the electronic devices. These inputs are common between the adjacent chips. Wires are bonded from contact locations on each chip to common leads. If a lead is common and cannot be mixed with another common lead, for example, a control line, it is located at the center of the lead frame. Other leads are provided which are not common between the two chips, for example chip select lines. Wires are bonded between the contact locations on each chip and at least one of the common leads of the lead frame.

11 Claims, 8 Drawing Sheets

LEAD FRAME PACKAGE FOR ELECTRONIC DEVICES

This is a file-wrapper continuation of application Ser. No. 08/171,890, filed Dec. 22, 1993 now abandoned which is a continuation of application Ser. No. 07/968,084, filed Oct. 28, 1992 now abandoned.

FIELD OF THE INVENTION

This invention relates to an electronic device packaging structures wherein at least one electronic device, e.g. a semiconductor ship, is disposed on a lead frame so that at least some of the leads project under the electronic device to provide electrical connection to a large number of electronic device contact locations at one edge of the electronic device. In a more particular aspect of the present invention, at least two chips are arranged in a stack so that portions of each electronic device having contact locations in the proximity of an edge thereof extends slightly beyond the boundary of the underlying electronic device to expose the contact locations of the underlying electronic device to form a stepped region. Most particularly, the present invention is directed to a structure having two electronic devices arranged in a stack which is disposed on a lead frame having leads which extend under the chip stack and where the electronic devices are memory devices which have a pre-determined arrangement of inputs and outputs so that some of the leads which extend under the chip stack can provide the means for a common electrical connection between device contact locations on the two electronic devices.

BACKGROUND OF THE INVENTION

To reduce the cost and increase the performance of electronic computers, it is desirable to place as many electronic circuits in as small a region as possible in order to reduce the distance over which electrical signals must travel from one circuit to another. This can be achieved by fabricating on a given area of a semiconductor chip as many electronic circuits as feasible for the given fabrication technology. Typically, these dense chips are disposed on the surface of a substrate.

A common means for providing electrical connection to an electronic device is using TAB (tape automated bonding) lead frames. A commonly used TAB lead frame is fabricated on a dielectric film, such as a polyimide film, which has a central window therein. A plurality of leads extend from the outer edge of the dielectric film inwardly towards the window region. The leads extend beyond the outer edge and the inner edge. Contact locations on an electronic device, e.g., a semiconductor chip, are electrically connected to the inner ends of the leads. The outer ends of the leads are electrically connected to contact locations on a packaging substrate.

Typically, these dense chips are disposed on the surface of a substrate in a side by side arrangement with space left therebetween to provide regions for electrical conductors for electrical interconnection of the chips. The chip contact locations can be electrically connected to substrate contact locations by means of direct wire bonding (wires bonded between the chip contact locations and the substrate contact locations). Alternatively, TAB can be used for this electrical connection. Alternatively, lead frames without a dielectric film can be used for these electrical connectors. Alternatively, semiconductor chips can be mounted in a flip-chip-configuration wherein an array of contact locations on the semiconductor chip are aligned with and electrically connected to an array of contact locations on the substrate by means of solder mounds disposed between corresponding chip and substrate contact locations. The side by side arrangement of electronic devices is not the most dense configuration which can be achieved.

The most dense packing configuration for semiconductor chips, in particular for memory chips, such as DRAMS, SRAMS, Flash EEPROMS and the like, may be obtained through the construction of stacks of semiconductor chips.

SUMMARY OF THE INVENTION

An object of the present invention is to provide a new and improved electronic device packaging structure for packaging integrated circuit chips, metallized dielectric substrates and the like.

Another object of the present invention is to provide a structure having an electrically interconnection means for providing electrical contact to a large number of electronic device contact locations at the edge of the electronic device using short wires for bonding.

An additional object of the present invention is to provide an electronic device packaging structure for a semiconductor memory chip wherein the density of the memory is readily increased by including two or more chips in the packaging structure wherein the chips have a predetermined symmetrical arrangement of the chip I/O.

A broad aspect of the present invention is a packaging structure containing an electronic device and a lead frame. The electronic device has a plurality of contact locations at an edge. The electronic device is disposed on the lead frame so that some of the leads extend under the electronic device. The ends of the leads are disposed in the vicinity of the edge of the electronic device having the contact locations thereat.

A more particular aspect of the present invention, is directed to a multiply dense memory structure wherein a plurality of electronic devices are disposed in a stack and wherein each electronic device has an edge having at least one contact location thereat and wherein the electronic devices are arranged to expose the contact locations on each electronic device edge by forming a stepped surface along at least one side of the electronic device stack. The stack is disposed on a lead frame wherein at least part of the leads extend under the stepped stack of electronic devices. Electrical connections are made between the contact locations on electronic devices of the stack to selected leads on the lead frame.

BRIEF DESCRIPTION OF THE DRAWINGS

These and objects, features and advantages of the present invention will become apparent upon a consideration of the following detailed description of the invention when read in conjunction with the figures, in which.

DETAILED DESCRIPTION

Figure 1:
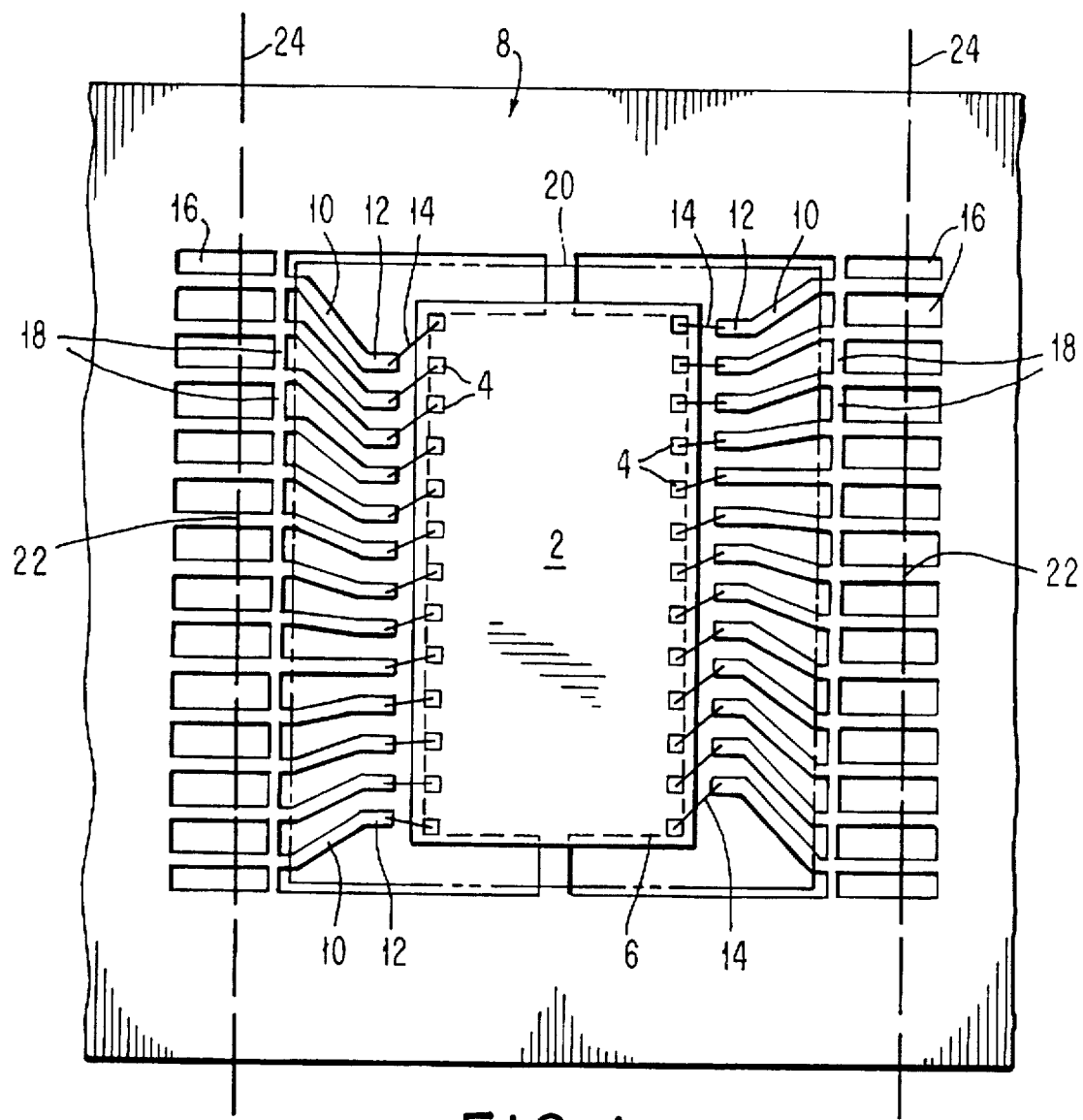
FIG. 1 shows a top view of an electronic device having contact locations at the periphery thereof wire bonded to a lead frame.

FIG. 1 shows a top view of a packaging structure wherein integrated circuit chip 2 has a plurality of contact locations 4 along the periphery 6 of chip 2. The chip is disposed in electrical contact with lead frame 8 which has a plurality of leads 10. The ends 12 of the leads 10 are electrically connected to contact locations 4 by wire bonds 14. Wire bonds 14 are made by conventional means (e.g. wire bonding, thermocompression bonding, ultrasonic bonding and the like). The lead frame 8 is formed from a metal layer into which apertures 16 are fabricated to form the leads 10. To provide structural integrity to the leads, the leads are joined by bar 18 (also referred to herein as a dam bar) which also serves as a barrier to the flow of an encapsulating dielectric material shown as outline 20. The dielectric is typically an epoxy which provides environmental isolation to the chip contact pads, the wire bonds 14 and the inner ends 12 of leads 20. Each lead has an outer end 22. Each outer end 22 is electrically connected to another level of packaging such as contact locations on a printed circuit board, metallized ceramic substrate and the like. The assembly of chip on lead frame is severed from the lead frame material by cutting along dotted line 24. The bar 18 is cut out between adjacent leads to electrically isolate the outer lead ends 22.

Figure 2:
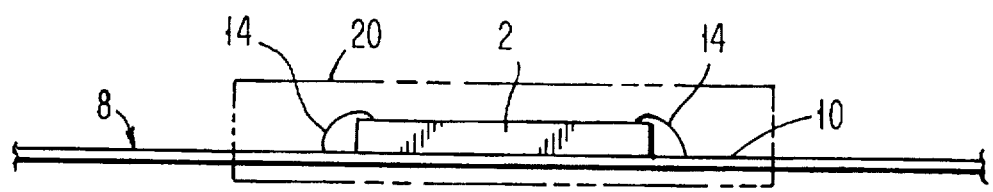
FIG. 2 shows a side view of the structure of FIG. 1.

FIG. 2 is a side view of the structure of FIG. 1.

Figure 3:
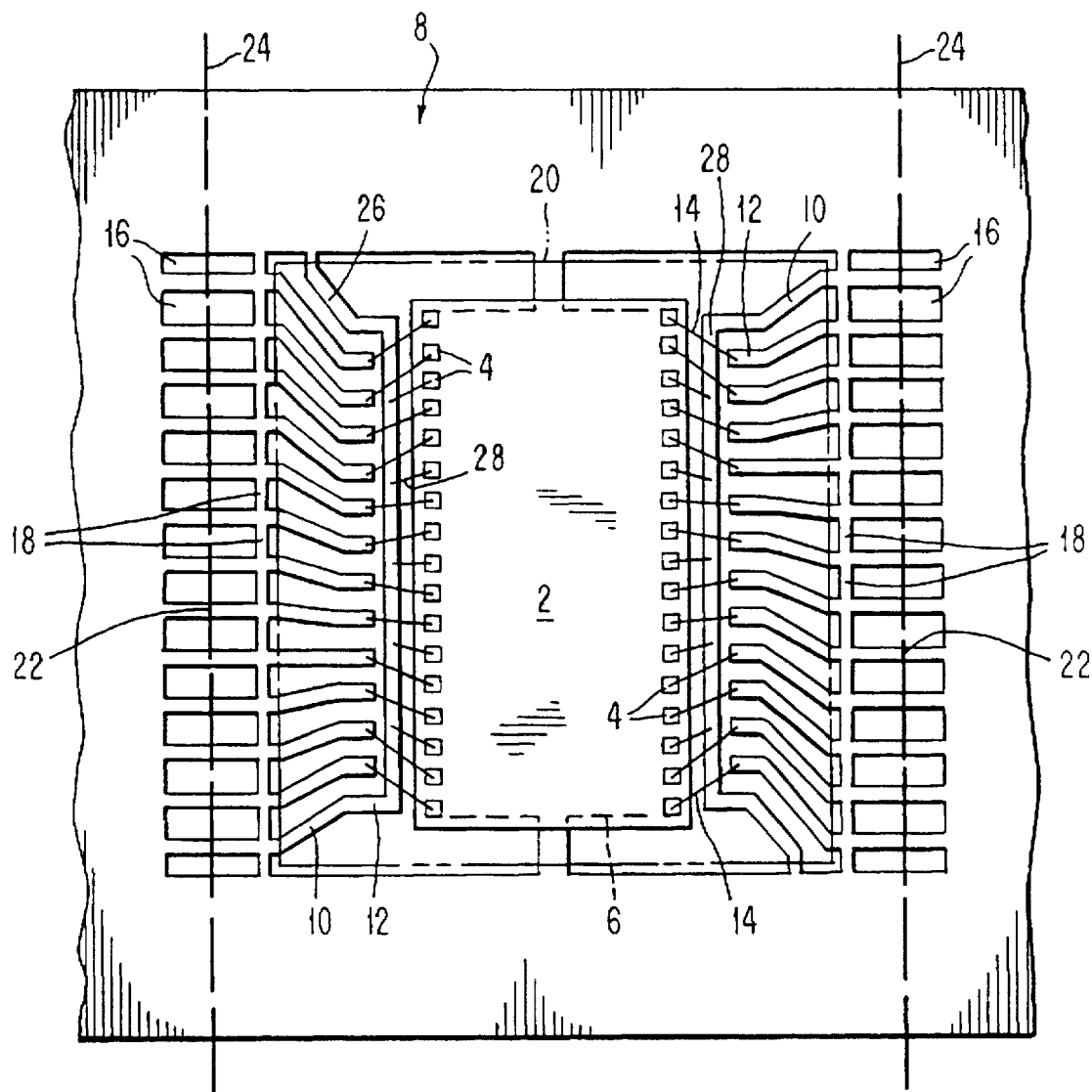
FIG. 3 shows a top view of an electronic device having contact locations at the periphery thereof wire bonded to a lead frame having a power and ground bus.
Figure 4:
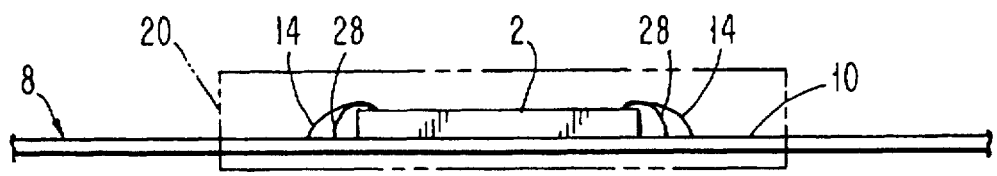
FIG. 4 shows a side view of the structure of FIG. 3.

FIG. 3 is a top view of an electronic device mounted in electrical connection to a lead frame wherein the lead frame has power or ground bus 26 and 28. FIG. 4 is a side view of the structure of FIG. 3. All numbers common between FIGS. 1, 2, 3 and 4 represent the same thing.

Electronic device contact location 4 is connected by wire bond 14 to power or ground bus 26 or 28.

Figure 5:
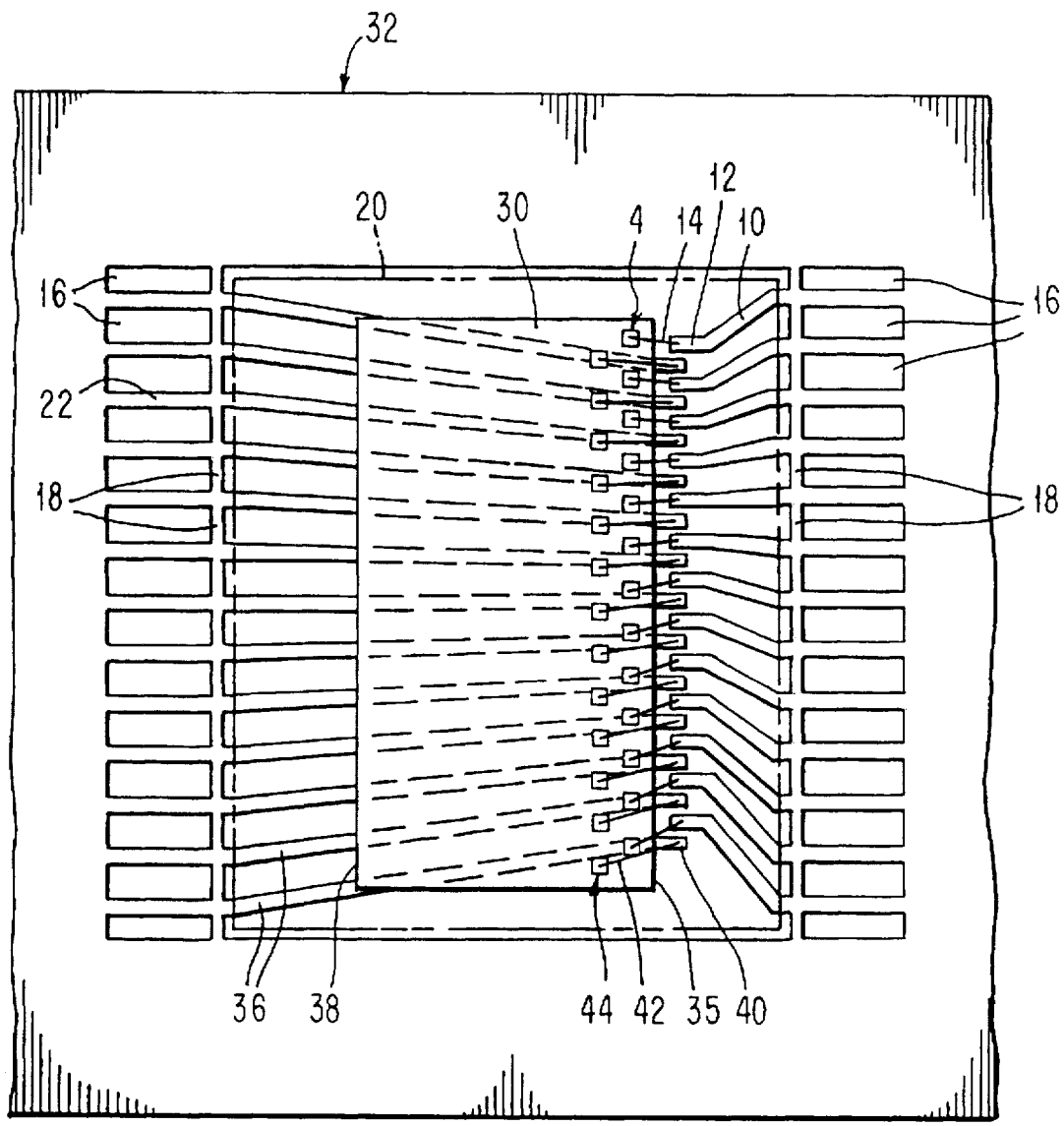
FIG. 5 shows a top view of a packing structure according to the present invention containing an electronic device having contact locations at an edge thereof which are wire bonded to the leads on a lead frame wherein some of the leads extend under the electronic device.
Figure 6:
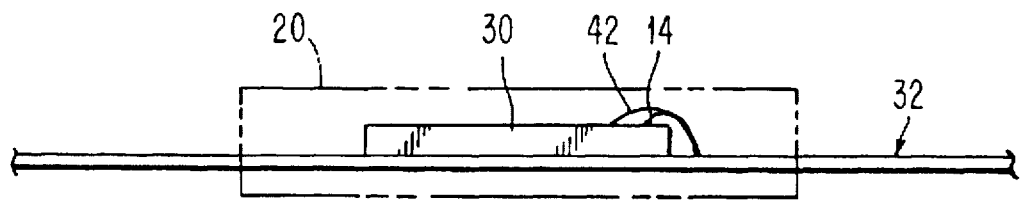
FIG. 6 is a side view of the structure of FIG. 5.
Figure 9:
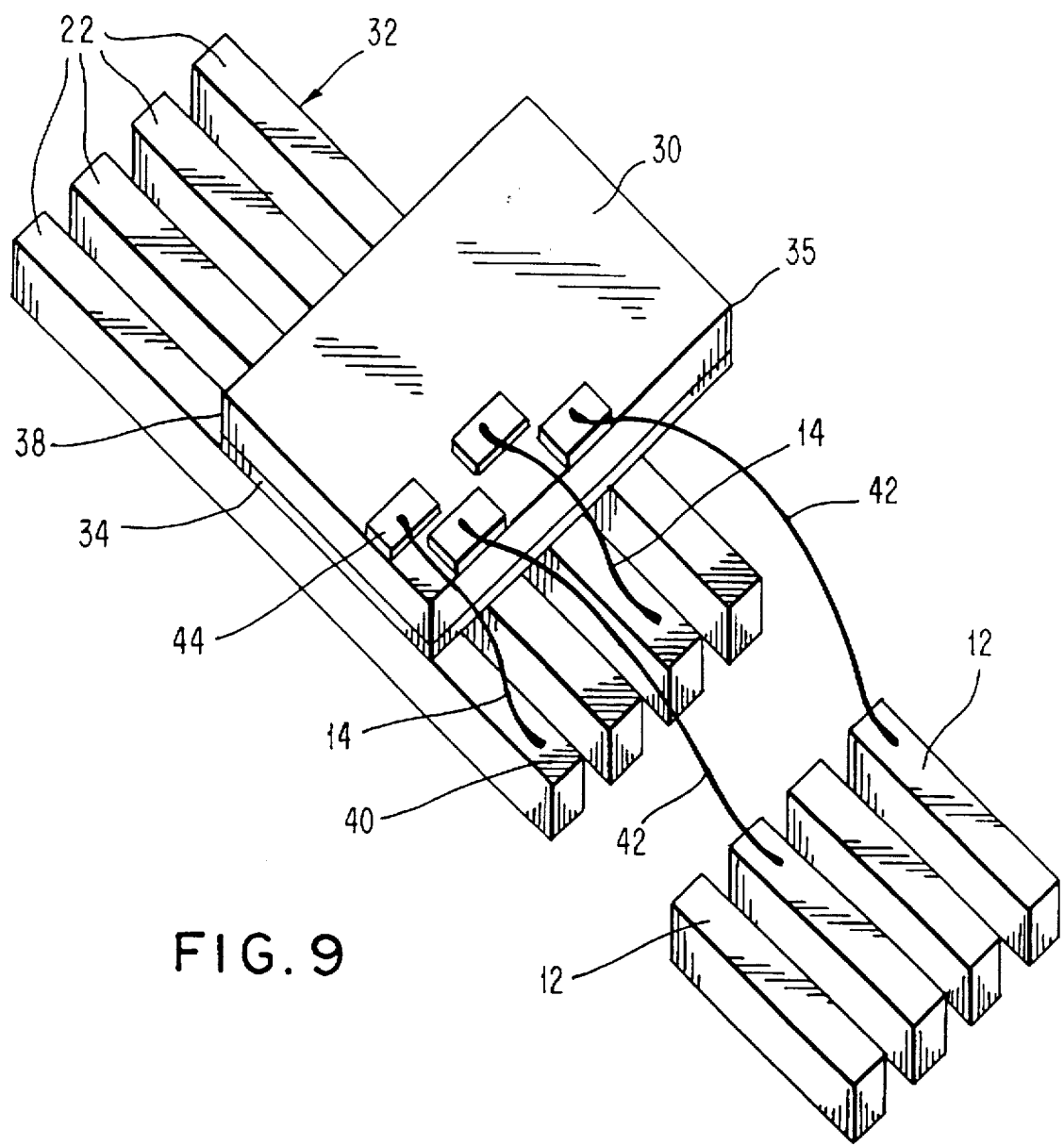
FIG. 9 is a schematic perspective view of the structure of FIG. 5.

FIG. 5 shows a top view of a structure according to the present invention wherein an electronic device is disposed on a lead frame. Since the electronic device is preferably a semiconductor chip, the structures will be described with reference thereto, but the structures are not so limited. Chip 30 is disposed in electrical communication with lead frame 32. Lead frame 32 is fabricated by conventional methods as is the lead frame 8 of FIG. 1. Chip 30 is disposed on lead frame 32 with preferably a dielectric adhesive layer 34 between lead frame 32 and chip 30. Dielectric adhesive layer 34 is shown in FIG. 9 which shows a schematic perspective view of the structure of FIG. 5. Numerals common between FIGS. 5, 6 and 9 represent the same thing. Numerals common between FIG. 1 and FIG. 5 represent the same thing. Chip 30 has two rows of contact locations which are on side 35 of chip 30. In order to wire bond this large number of chip contact locations to the inner ends of the leads of a lead frame 32, the leads 36 of lead frame 32 which are on side 38 of chip 30 extend underneath chip 30. Leads 36 extend out beyond edge 35 of chip 30 and having lead ends 40 which are preferably wire bonded by wires 42 to the interior row of chip contact locations such as pad 44. If a lead frame of the type show in FIG. 1 were used, the interior row 46 of chip contact locations would require a long length of wire to be bonded to lead ends which were in the vicinity of chip edge 38. Since wire bond wires are uninsulated, such long wires would have a high probability of shorting between each other resulting in a defective chip package. They would also have a large inductance which is a property of thin conductors. The portion of the leads 36 which extend under chips 30 are shown in FIG. 5 in phantom. FIG. 9 shows the structure of FIG. 5 schematically in perspective with the leads excised from the lead frame.

Figure 7:
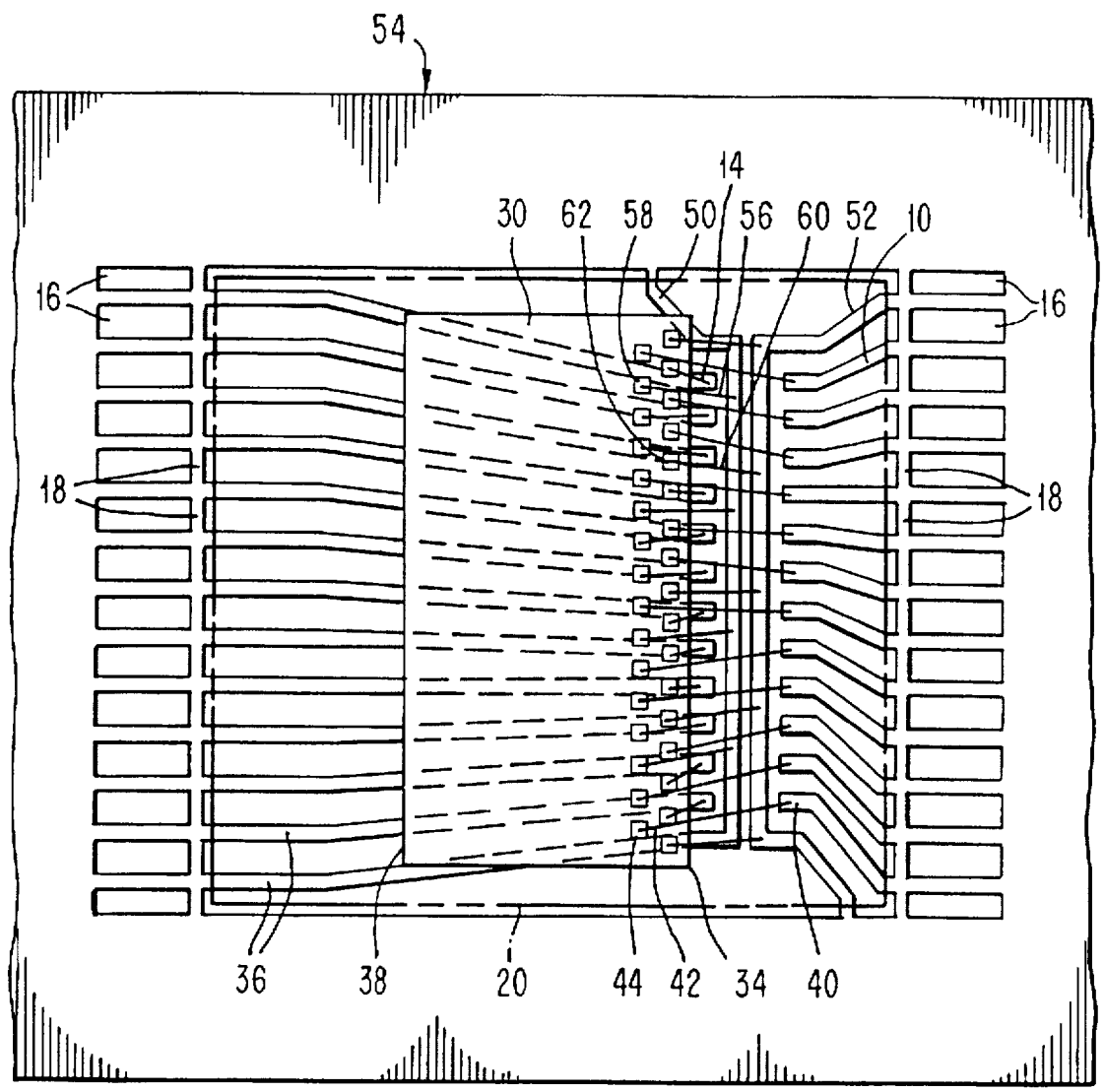
FIG. 7 is a top view of a structure according to the present invention wherein an electronic device having contact locations at an edge thereof is disposed on a lead frame wherein at least a portion of the leads extends under the chips and wherein the lead frame has a power and ground bus.
Figure 8:
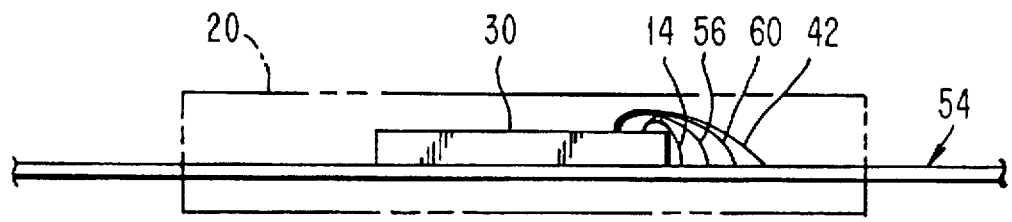
FIG. 8 shows a side view of the structure of FIG. 7.

FIG. 7 shows an embodiment of the present invention similar to the embodiment of FIG. 6, wherein the lead frame 54 of FIG. 7 further includes power and ground bus 50 and 52. All numbers common between FIGS. 7, 8 and FIG. 5 represent the same thing. In FIG. 7, there is shown wire bond 56 which connects chip contact pad 58 to power or ground bus 50 and wire bond 60 which connects chip contact pad 62 to power or ground bus 52.

Figure 10:
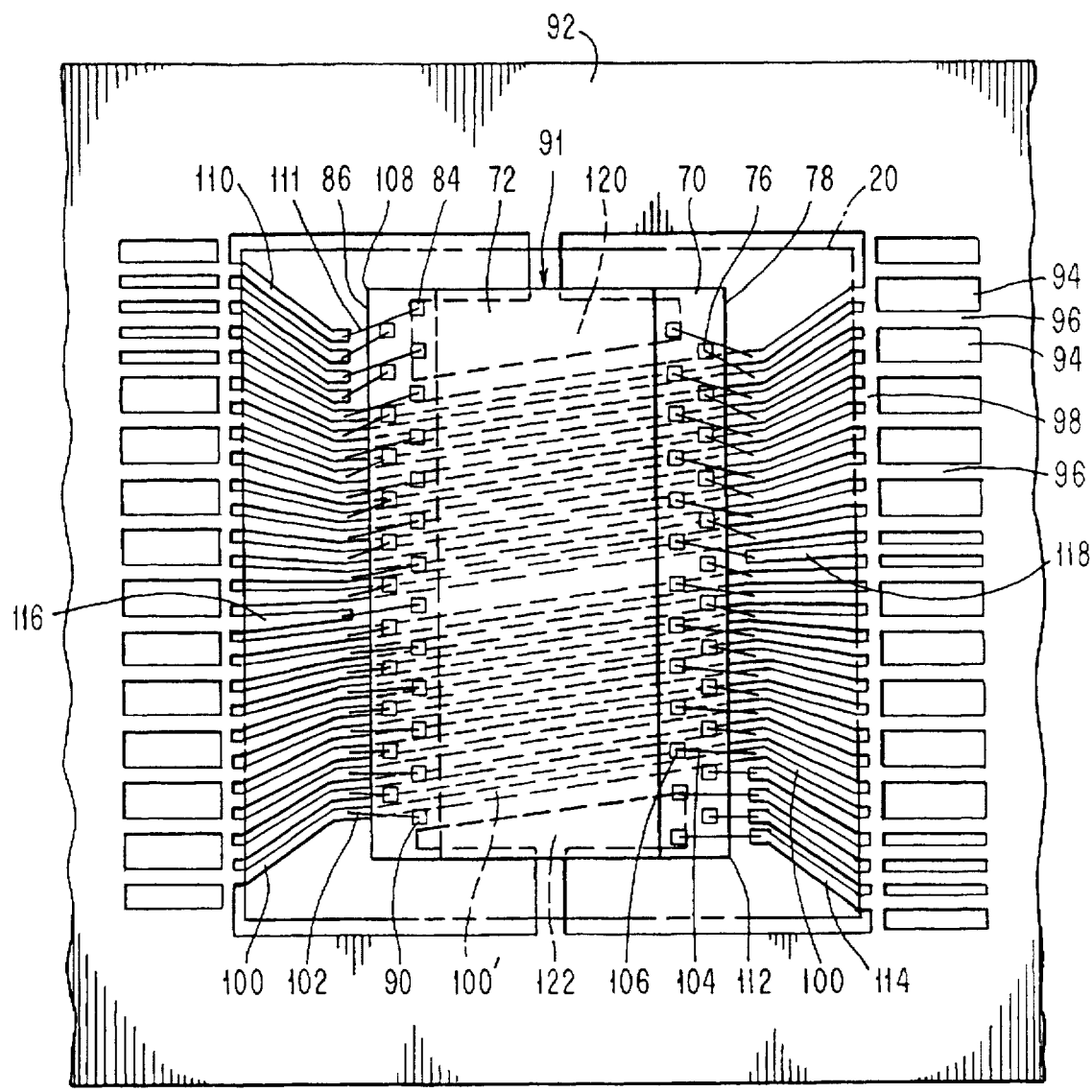
FIG. 10 is a top view of a structure according to the present invention wherein there are two electronic devices stacked, one of top of each other, and disposed on a lead frame wherein the portion of the leads extends under the electronic device stack.
Figure 11:
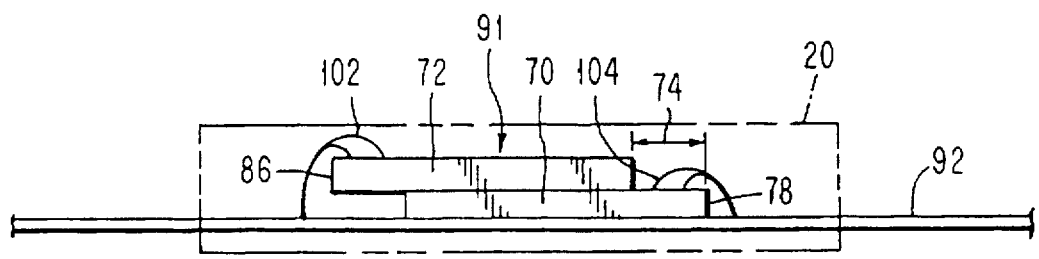
FIG. 11 is a side view of the structure of FIG. 10.
Figure 12:
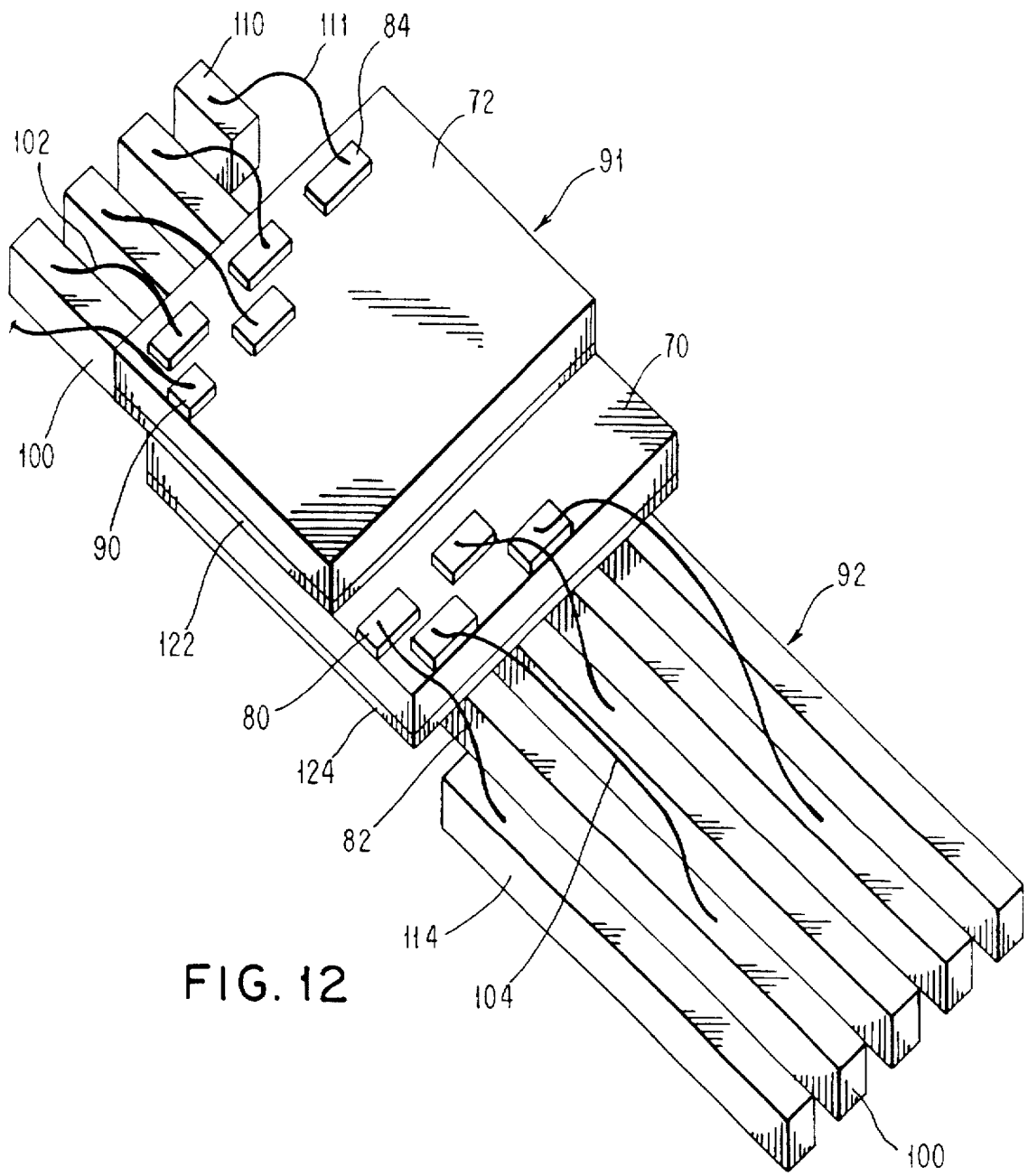
FIG. 12 is a schematic perspective view of the structure of FIG. 10.
Figure 13:
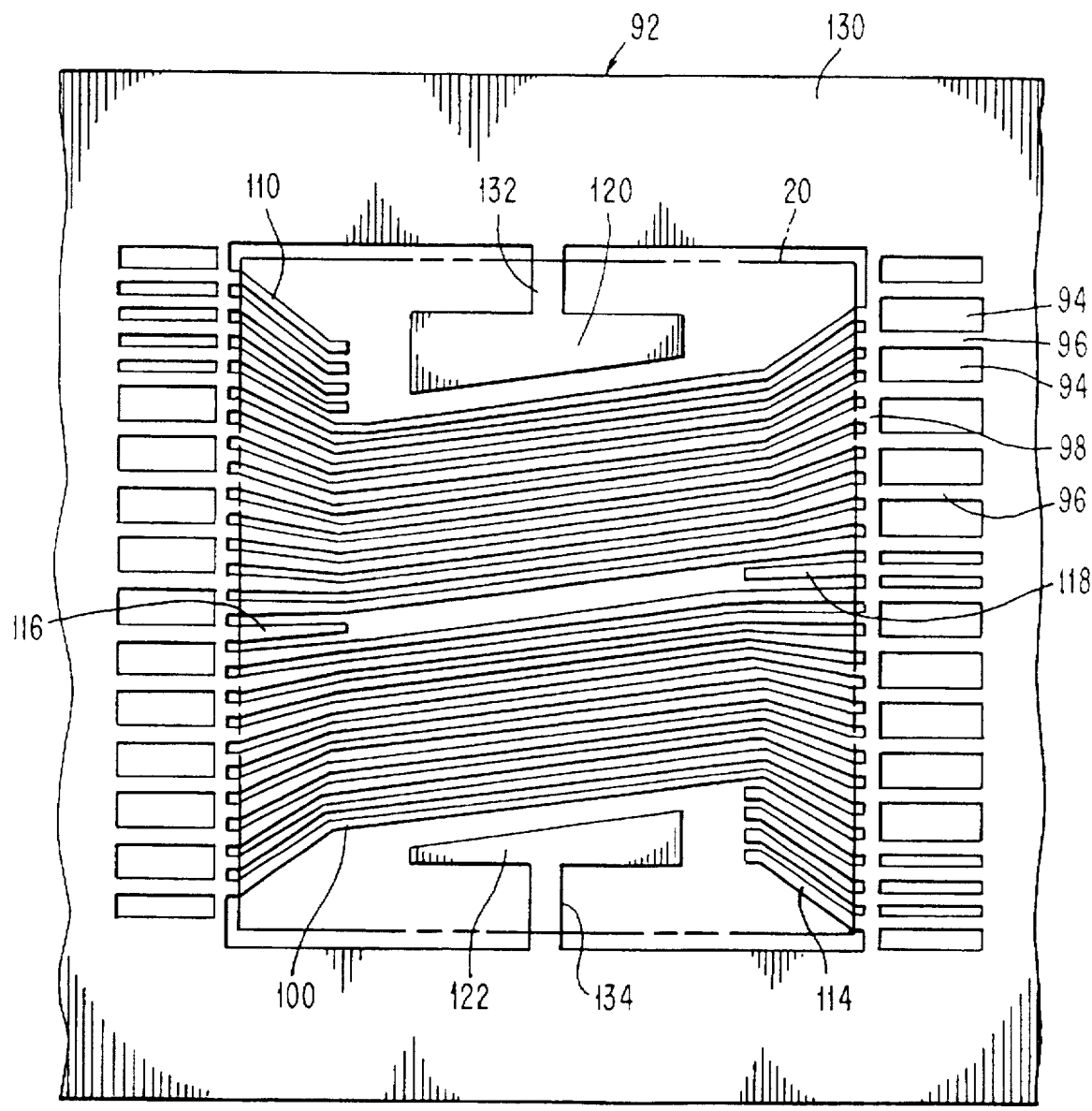
FIG. 13 is a top view of the lead frame of FIG. 10 without the electronic device stack disposed thereon.

FIG. 10 shows a top view of lead frame of the type used in FIGS. 5 and 7 with two chips 70 and 72 arranged in a stack. Each electronic device 70 and 72 can be any type of electronic device, such as a dielectric material having electrically conductive lines therein, for example a printed circuit board and a metallized ceramic or integrated circuit chips such as semiconductor chips. Preferably, electronic devices are semiconductor chips, for example, silicon chips and gallium arsenide chips. Each electronic device is stacked onto an adjacent device with an edge on each device set back by a distance 74 from the adjacent device. Device 70 has at least one contact location 76 at edge 78. Device 72 has at least one contact location 84 in the vicinity of edge 86. FIG. 11 shows a side view of the structure of FIG. 10. FIG. 12 shows a schematic perspective view of the structure of FIG. 10. FIG. 13 shows a top view of the lead frame of the structure of FIG. 10 without the electronic device stack 91 disposed thereon. All numerals common between FIGS. 5, 10, 11, 12 and 13 represent the same thing.

Chip stack 91 is disposed on lead frame 91. Lead frame 92 has a plurality of apertures 94 which define outer lead ends 96. The outer lead ends are joined by dam bar 98, as described herein above, are severable to separate the outer lead ends 96. There are a plurality of outer lead ends, some of which 100 extend under the chip stack 91. The portion of inner lead 100 which is under the chip stack 91 is shown in phantom as 100'. Inner lead 100 at edge 86 of chip 72 is connected by wire bond 102 to chip pad 90 of chip 72. Inner lead 100, at edge 78 of chip 70 is connected by wire bond 104 to chip pad 106 of chip 70. In the vicinity of corner 108 of chip 72, where are a plurality of inner leads 110 which do not project under the chip stack. In the vicinity of corner 112 of chip 70 there are corresponding plurality of leads 114 which do not project under the chip stack.

The structure of FIG. 10 is preferably useful for a double dense memory containing two memory chips. The leads which project under the chip provide a means of establishing common connections between the chips, for example, power, ground address and control lines. The inner leads 110 and 114, which are not common between both chips, are used to bring out unique lines such as data bits for cases where both chips are simultaneously accessed, or chip enable lines for cases there only one chip is enabled. In this latter case the data lines would be common. Such unique leads may also be in the interior of the plurality of leads, such as leads 116 and 118.

FIG. 10 shows a rotational symmetry about an axis perpendicular to and centered on the chip stack 91. This is to complement the preferred case of both chips 70 and 72 being identical. To understand the requirements on the leadframe, we observe that there are three types of I/O function; independent I/O, common I/O and common I/O which can be mixed with other common I/O. I/O pads which are unique to each chip (like data lines for simultaneous access of the chips, or chip enable lines) are preferably placed at the ends of the leadframe, but may be placed in the leadframe interior as in leads 116 and 118. The I/O pad which is common for the two chips, like an address strobe, is placed at the lead-frame midpoint. The remaining I/O pads which are common for the two chips but which can be interchanged, for example, address bits, lie between the center lead and the unique leads. Power and ground pads are treated as if they were common I/O which can be mixed. Both the chip and the leadframe have corresponding symmetry.

Although leadframe 92 has the above rotational symmetry, it is still possible to have a non-symmetrical pattern of wire-bonds to facilitate particular lead function assignments. For example, a first wirebond pad may be bonded to a first lead for the bottom chip and to a second lead for the top chip, space permitting.

The lead frame has tables 120 and 122 which are used to provide additional structural support for the chip stack 90. The teaching of copending U.S. patent description Ser. No. 07/760,038 filed Sep. 13, 1991, which shows stepped chip stacks and method of fabrication, and which is assigned to the assignee of the present invention, is incorporated herein by reference.

FIG. 12 shows a perspective view of the structure of FIG. 10. Numerals common between FIGS. 10, 12 and 13 represent the same thing. Between chips 70 and 72 there is a dielectric adhesive layer 122 and between chip 70 and lead frame 92, there is a dielectric adhesive layer 124. FIG. 13 is a top view of the lead frame 92 of FIG. 10 without the chip stack disposed thereon. Support pads 120 and 122 are connected to the lead frame 92 body 130 by lead frame members 132 and 134 respectively.

Leads extending under the chip or chip stack allows common connections to be made between the electronic devices, such as address and control connections on memory devices, and to be made within the first level structure thus increasing the overall density of an electronic system. The lead frame itself allows for test and burn-in of the module and provides a convenient means of soldering the module and the next level package, i.e. a circuit card.

In summary, new and improved lead frames are described wherein at least part of the leads extend under the electronic device (or stack) for electrical interconnection to electronic device contact locations.

While the present invention has been shown and described with respect to specific embodiments, it will be understood that it is not thus limited. Numerous modifications, changes and improvements will occur which fall within the scope and spirit of the invention.

What is claimed is:

1. A structure comprising:
   a first electronic device;
   a second electronic device;
   a lead frame;
   said first electronic device and said second electronic device have an output rotational symmetry about an axis perpendicular to said first and said second electronic devices;
   said first electronic device is disposed on said lead frame;
   said second electronic device is disposed on said first electronic device to form a stack;
   said lead frame has a rotational symmetry corresponding to said output rotational symmetry;
   said first electronic device has a plurality of first contact locations in the vicinity of an edge of said first electronic device;
   a part of said plurality of leads is disposed under said stack; and
   individual ones of said leads electrically interconnect outputs on each of said first electronic device and said second electronic device having a common function;
   means for electrically interconnecting said first contact locations and said second contact locations to said leads.

2. The structure of claim 1, wherein said means are wires bonded between said contact locations and said ends.

3. The structure of claim 1, wherein another portion of said leads extends towards said first edge, said another portion of said leads do not extend under said stack.

4. The structure of claim 1, wherein said first and said second electronic devices are selected from the group consisting of a semiconductor chip, a printer circuit board, a circuitized glass substrate, a circuitized ceramic substrate and a circuitized polymeric substrate.

5. The structure of claim 1 wherein in said first electronic device is disposed adjacent said second electronic device to form a stack having a contact location side disposed in a manner to expose said first and said second plurality of contact locations on each of said first and said second electronic devices at said contact locations side.

6. The structure of claim 5, further including an adhesive between said first electronic device and said second electronic device.

7. The structure of claim 5, wherein said first and said second electronic devices are memory integrated circuit chips.

8. The structure of claim 1, wherein said first electronic device is disposed on said lead frame and said second electronic device is disposed on said first electronic device so that said first plurality of contact locations is in the vicinity of a first edge of said first said electronic device and second plurality of contact locations is in the vicinity of a second edge of said second electronic device, said first edge and said second edge are on opposite sides of said stack.

9. The structure of claim 1, wherein said first and said second electronic devices are circuitized dielectric substrates.

10. The structure of claim 1, further including a substrate having substrate contact locations, said leads have outer ends, said outer ends are electrically interconnected to said substrate contact locations.

11. A structure according to claim 1, wherein said first electronic device is identical to said second electronic device.

* * * * *